United States Patent
Thompson et al.

(10) Patent No.: US 6,956,775 B1
(45) Date of Patent: Oct. 18, 2005

(54) WRITE POINTER ERROR RECOVERY

(75) Inventors: Derek A. Thompson, Portland, OR (US); Darrell S. McGinnis, Hillsboro, OR (US); Steve A. McKinnon, Portland, OR (US); John Zumkehr, Orange, CA (US)

(73) Assignee: Intel Corporation, Santa Clara, CA (US)

( * ) Notice: Subject to any disclaimer, the term of this patent is extended or adjusted under 35 U.S.C. 154(b) by 120 days.

(21) Appl. No.: 10/749,467

(22) Filed: Dec. 31, 2003

(51) Int. Cl.[7] .............................................. G11C 16/04
(52) U.S. Cl. ........................... 365/189.02; 365/230.02; 365/230.06; 365/193
(58) Field of Search .......................... 365/189.02, 193, 365/230.06, 230.02

(56) References Cited

U.S. PATENT DOCUMENTS 5,398,209 A * 3/1995 Iwakiri et al. ......... 365/230.03
6,172,927 B1 * 1/2001 Taylor ........................ 365/219
6,853,588 B2 * 2/2005 Kim et al. ............. 365/189.01

* cited by examiner

Primary Examiner—Anh Phung
Assistant Examiner—Tuan T. Nguyen
(74) Attorney, Agent, or Firm—Troutman Sanders LLP; James Hunt Yancey, Jr.

(57) ABSTRACT

A write pointer (21) from a write pointer circuit (13) may cause a demultiplexer circuit (12) to direct data from a memory cell (11A–11N) to a desired bit location (0–4) in a register 14. A read pointer (20) may cause a multiplexer circuit (15) to select data from a desired bit location in the register to provide as output data (19) or to select one of the bits of the write pointer. The write pointer may be incremented by a data strobe signal (17). The state of the write pointer may be determined by reading the bits of the write pointer, and the write pointer may be synchronized via a reset line (18).

6 Claims, 2 Drawing Sheets

WRITE POINTER ERROR RECOVERY

BACKGROUND

Multiple memory cells may provide data via a buffer, typically a first-in, first-out (FIFO) circular buffer having a length of N bits. When a memory cell provides the data to the buffer a data strobe is also provided to strobe the data into the buffer. The data strobe may also cause the write pointer for the buffer to be incremented so that the next data will go into the next location in the buffer. As many systems use multiple-bit (L bits) words, a plurality (L) of these buffers is used, one for each bit in the word. When a word is read from the buffers, the same bit position (K) of all the buffers is read. Thus, the integrity of the data provided by the buffers depends upon the write pointers for these buffers being in unison. However, if a data strobe is faulty, due to noise or some other event, then the write pointer for a buffer may not be incremented correctly. Typically, it will not be incremented, but it could possibly be incremented twice or more, rather than just once. In that event, the write pointer for that buffer will then be out of sync with the write pointer for the other buffers, so the data will be written into the wrong location (K−1, K+1, K+2, etc.) for that buffer. Then, when the buffers are read, the data in the Kth position for that buffer will not be the desired data, but will be the data from a preceding or subsequent memory read. Thus, the data output by that buffer will be incorrect, and so the data word output by the buffers will be corrupted.

DETAILED DESCRIPTION

Figure 1:
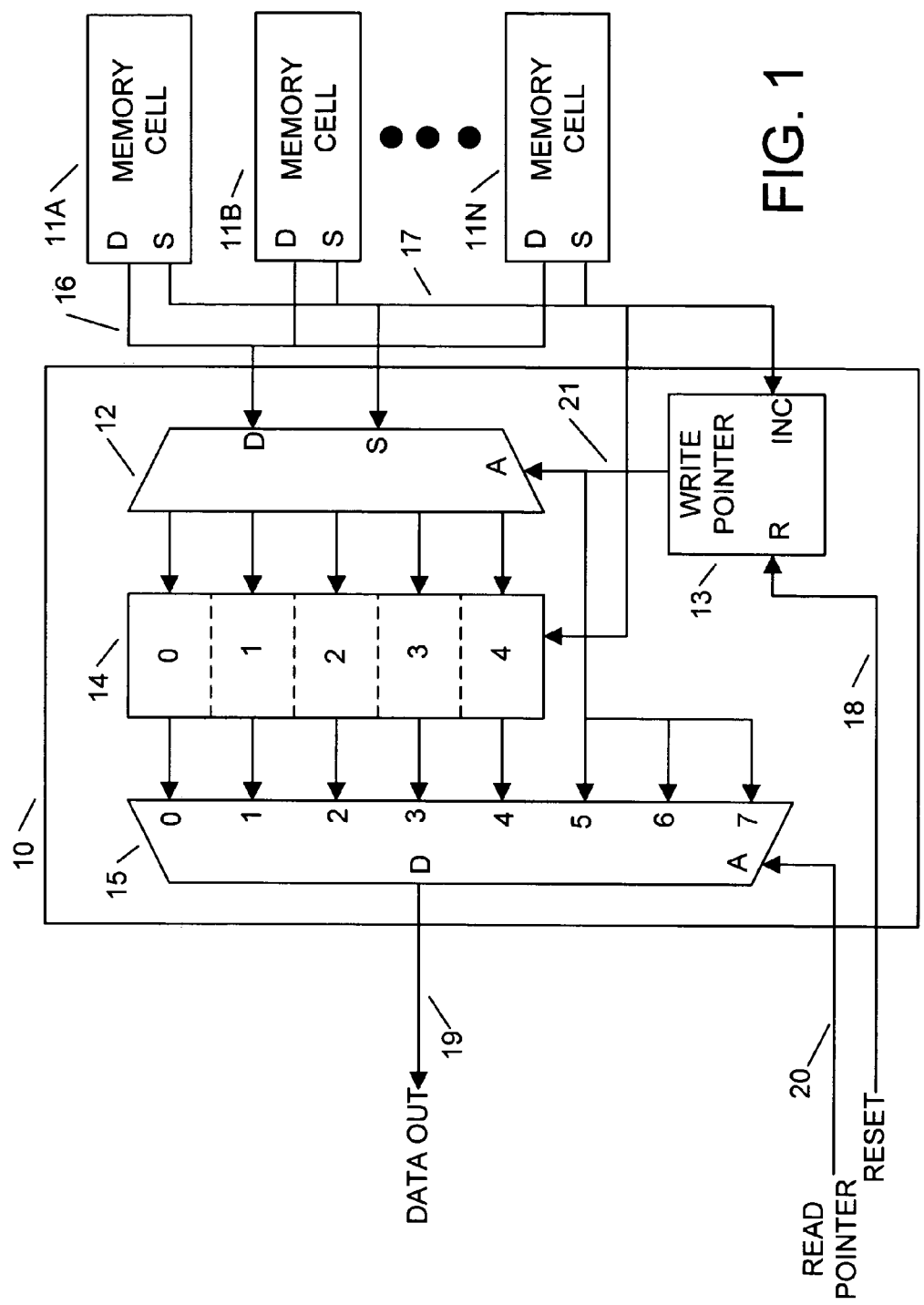
FIG. 1 is a block diagram of an exemplary embodiment.

FIG. 1 is a block diagram of an exemplary embodiment. A buffer circuit 10 may be connected to a plurality of memory cells 11A–11N. The data outputs (D) of the memory cells 11A–11N may be connected in parallel, as shown, and provided to the buffer circuit 10. Also, the data strobe outputs (S) of the memory cells 11A–11N may be connected in parallel, as shown, and provided to the buffer circuit 10. A particular bit of data in the buffer circuit 10 may be selected using the read pointer on line 20 and read out via the data out line 19.

The buffer circuit 10 may include an incoming data demultiplexer, switch, or other circuit 12, a write pointer circuit 13, a register 14 having a plurality of bits (0–4), and an outgoing data multiplexer, switch, or other circuit 15. The data output of the memory cells may be provided to the data (D) input of the demultiplexer 12, and the data strobe output of the memory cells may be provided to the data strobe (S) input of the demultiplexer 12. The demultiplexer 12 may have any desired number of outputs, dependent somewhat upon the number of bits in the register 14 and upon the range provided by the write address (A) on line 21, and may be, for example, 5 outputs, as shown. The register 14 may have any desired number of bits, dependent somewhat upon the number of outputs from the demultiplexer 12 and the number of inputs of the multiplexer 15, and may have, for example, 5 bits, as shown. The multiplexer 15 may have any desired number of inputs, dependent somewhat upon the number of bits in the register 14 and upon the range provided by the read address (A) on line 20. The output (D) of the multiplexer 15 may be the data output on line 19.

The write pointer circuit 13 may provide a write address (A) to the demultiplexer 12, which may instruct the demultiplexer 12 as to which bit of the register 14 any incoming data on line 16 may be placed. The read pointer on line 20 may provide a read address (A) to the multiplexer 15, which may instruct the multiplexer 15 as to which bit of the register 14 should be used to provide the outgoing data on line 19.

If the write pointer address is, for example, 3 bits, then eight locations may be specified. However, in the embodiment shown, only five locations are used in the register 14. Therefore, if the read pointer address is also, for example, 3 bits, but only five addresses are used to designate the five locations in the register 14, then three addresses are available. In the exemplary embodiment, these three address are used to select the three bits of the write pointer.

Assume, for convenience, that the write pointer is at address 000 and that memory cell 11A provides a data bit on line 16 and a data strobe on line 17. The demultiplexer 12 may route the incoming data to bit 0 of register 14 where may be written in accordance with the data strobe on line 21, for example, the leading edge or the trailing edge of the strobe. The data strobe on line 21 may also then increment the write pointer in the write pointer circuit 13, for example, on the opposite edge of the strobe, so that the write pointer will then be at address 001 for the next bit to be written.

Assume now, for convenience, that memory cell 11B provides a data bit on line 16 and a data strobe on line 17. The demultiplexer 12 may route the incoming data to bit 1 of register 14 where may be written in accordance with the data strobe on line 21. The data strobe on line 21 may also then increment the write pointer in the write pointer circuit 13 so that the write pointer will then be at address 002 for the next bit to be written.

This process may be repeated as other memory cells provide data and a strobe. In the exemplary embodiment shown, register 14 has 5 bits, so the write pointer increments from 0 to 4, and then rolls over to 0 again.

Assume now that it is desired to read the data. The read pointer on line 20 may be set, for example, to address 000, which may cause the multiplexer 15 to provide the data from bit 0 of register 14 onto line 19. The read pointer may then be incremented to address 001, which may cause the multiplexer 15 to provide the data from bit 1 of register 14 onto line 19. This process may be repeated to obtain the data from other bits of register 14. In the exemplary embodiment shown, register 14 has 5 bits, so the read pointer may have a value from 0 (000) to 4 (100) to read the contents of register 14.

In the exemplary embodiment shown, the write pointer on line 21 may also be provided to the multiplexer 15. Therefore, the write pointer may be read, one bit at a time, through the multiplexer 15. For example, if the read pointer is set to 5 (101), then the multiplexer 15 may provide one of the address bits on line 21. Then, for example, if the read pointer is set to 6 (110), then the multiplexer 15 may provide a second one of the address bits on line 21. Finally, for example, if the read pointer is set to 7 (111), then the multiplexer 15 may provide the third one of the address bits on line 21. Therefore, even though the write pointer may be incremented by the data strobe and may not otherwise be directly controllable, it may still be observed so that it may be possible to determine the address provided by the write pointer. Further, the write pointer circuit 13 may be instructed to reset the write pointer by, for example, asserting the reset line 18. It will be appreciated that the reset line 18 may also be used to preset the write pointer to any desired starting point. However, for convenience, a reset to 000 may be used.

Therefore, it may be possible to observe the state of the write pointer and, if desired, such as when the state of the write pointer is incorrect or unknown, it may be possible to reset the write pointer to a desired starting address.

Figure 2:
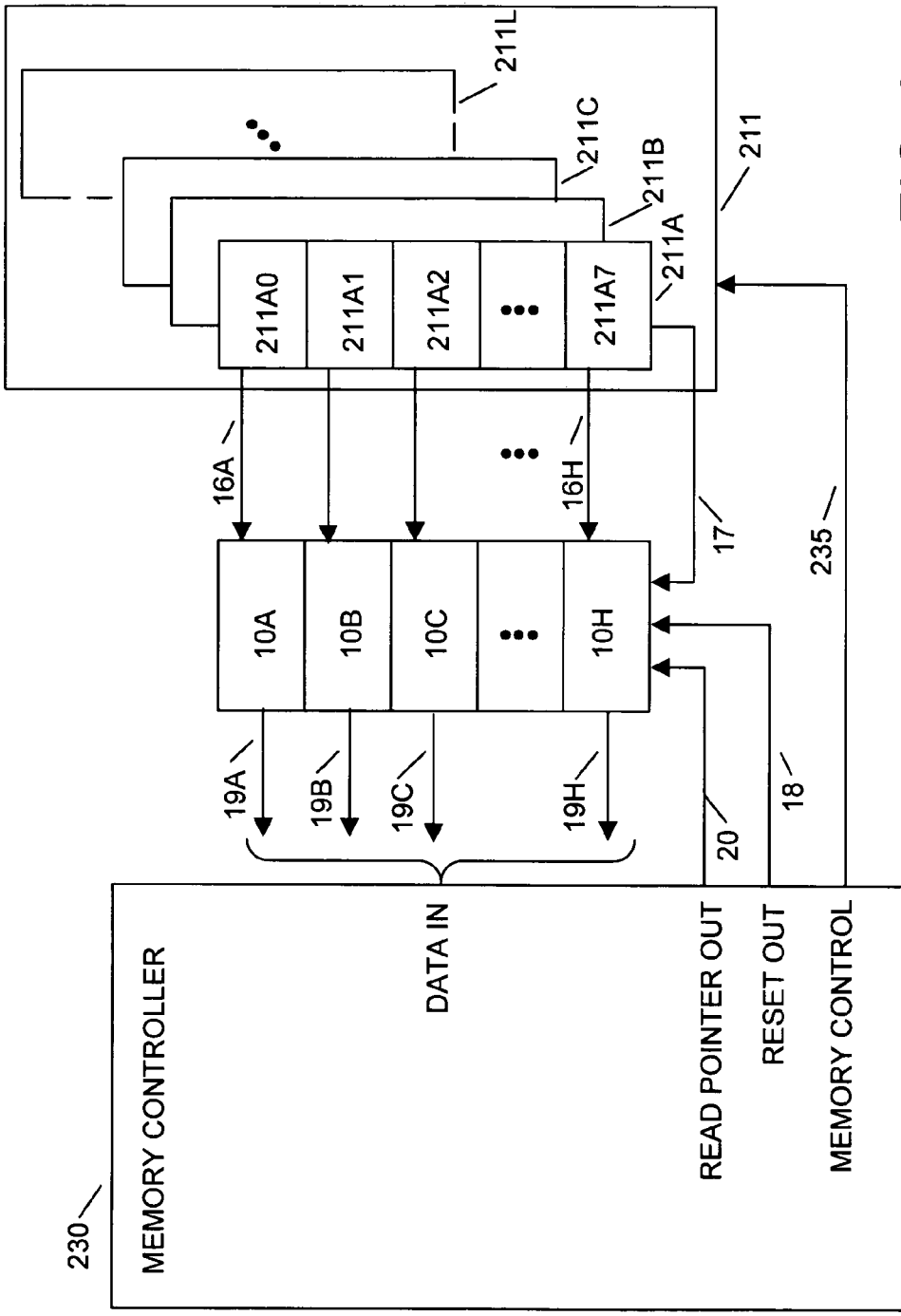
FIG. 2 is a block diagram of an exemplary embodiment in an exemplary environment.

FIG. 2 is a block diagram of an exemplary embodiment in an exemplary environment. In the environment shown, a memory 211 may have a plurality of memory modules 211A–211L. For convenience, and as a limitation, it is assumed that a data word is 8 bits, so each memory module may have 8 bits, and bits 211A0–211A7 for memory module 211A are shown. Memory modules 211B–211 may be identical to memory module 211A. The memory 211 may have a plurality of data output lines 16A–16H, and a data strobe line 17. Only one data strobe line 17 is shown for a memory module, such as memory module 211A, because the memory module typically only provides a single data strobe output signal on a single data strobe output line when all of the bits 211A0–211A7 are available. The data strobe outputs for the plurality of memory modules 211A–211L may be connected in parallel. Similarly, the data outputs for the same bit positions (0–7) of modules 211A–211L may be connected in parallel. Thus, for example, data line 16A may carry the bit position 0 data output from whichever of the memory modules 211A–211L is providing the data at that time.

A corresponding plurality of buffer circuits 10A–10H may be used, as shown, for the 8 bit data word. The outputs of the buffer circuits may be provided on lines 19A–19H to the DATA IN input of a memory controller 230. The memory controller 230 may also provide the read pointer to the buffer circuits on line 20, and may provide the reset signal to the buffer circuits on line 18.

Consider now the exemplary operation of the embodiment shown. For convenience, assume that the initial write pointer address for each of the buffer circuits 10A–10H may be 000, and that memory module 211A may provide an 8-bit data word on lines 16A–16H and to the buffer circuits 10A–10H, respectively. When the memory module 211A provides a data strobe signal on line 17, the buffer circuits 10A–10H may latch the data into address (bit position) 000, and then may increment the write pointer so that the write pointers of buffer circuits 10A–10H may point to address 001. Assume now that memory module 211B may provide an 8-bit data word on lines 16A–16H and to the buffer circuits 10A–10H, respectively. When the memory module 211B provides a data strobe signal on line 17, the buffer circuits 10A–10H may latch the data into address (bit position) 001, and then may increment the write pointer so that the write pointers of buffer circuits 10A–10H may point to address 010.

Assume now that memory module 211C may provide an 8-bit data word on lines 16A–16H and to the buffer circuits 10A–10H, respectively. Also assume that there is some noise on the data strobe line 17 and that, because of the normal manufacturing differences between buffer circuits 10A–10H, when the memory module 211A provides a data strobe signal on line 17 buffer circuits 10A and 10C–10H are unaffected by the noise, but buffer circuit 10B is affected by the noise and does not recognize the data strobe. The buffer circuits 10A and 10C–10H may latch the data into address (bit position) 010, and then may increment the write pointer so that the write pointers of buffer circuits 10A and 10C–10H may now point to address 011. However, buffer circuit 10B may not latch the data, so the data in that bit position (010) may not be incorrect. Further, buffer circuit 10B may not increment the write pointer, so the write pointer in buffer circuit 10B remains at 010.

Assume now that memory module 211L may provide an 8-bit data word on lines 16A–16H and to the buffer circuits 10A–10H, respectively. When the memory module 211L provides a data strobe signal on line 17, the buffer circuits 10A–10H may latch the data into the addresses (bit position 011) shown by their respective write pointers, but the data for buffer 10B may be at the wrong address (bit position 010) because the write pointer for buffer circuit 10B may not have been in synchronization (may have been incorrect) with respect to the other buffer circuits 10A and 10C–10H.

Assume now that the memory controller 230 may be attempting to read the data from the buffer circuits 10A–10H. Assume that memory controller 230 first sets the read pointer to address 000. The buffer circuits 10A–10H may provide the correct data on lines 19A–19H.

Assume now that the memory controller 230 may now set the read pointer to address 001 to read the data from the buffer circuits 10A–10H. Assume now that the memory controller 230 may now set the read pointer to address 010 to read the data from the buffer circuits 10A–10H. It will be recalled that the buffer circuit 10B failed to advance the write pointer, so the data in bit position 010 will actually be the data that should have been in bit position 011. If not corrected, this type of error may propagate and corrupt the data indefinitely.

However, the memory controller 230, at periodic intervals, or when the memory controller 230 is not asking the buffer circuits 10A–10H to provide data previously provided by the memory modules 211A–211L, the memory controller 230 may act to verify the status of the various write pointers. This may be accomplished, as mentioned, by setting the read pointer to read the write pointer state, which may be one bit at a time. The memory controller 230 may, for example, set the read pointer to address 101 to read the first bit of the write pointer for each of the buffer circuits 10A–10H. If the write pointers are in synchronization, then all of these bits should have the same value, whether logic 0 or logic 1. The memory controller 230 may then, for example, set the read pointer to address 110 to read the second bit of the write pointer for each of the buffer circuits 10A–10H. If the write pointers are in synchronization, then all of these bits should also have the same value, whether logic 0 or logic 1. Finally, the memory controller 230 may, for example, set the read pointer to address 111 to read the third bit of the write pointer for each of the buffer circuits 10A–10H. If the write pointers are in synchronization, then all of these bits should have the same value, whether logic 0 or logic 1.

If all of the buffer circuits 10A–10H have the same value for the first bit of the write pointer, the second bit of the write pointer, and the third bit of the write pointer, then the write pointers are in synchronization.

However, if any buffer circuit 10A–10H has a value for any bit of the write pointer which is not the same as the other write pointers, then the write pointers may not be in synchronization and so corrective action may need to be taken.

In the embodiment shown, if the write pointers are not in synchronization, the memory controller 230 may send a reset signal on line 18 to the buffer circuits 10A–10H. This may set all of the write pointers to the same value, such as 000, so that the write pointers may again be in synchronization. If synchronization is performed, the memory controller 230 may then request or instruct that the data read since the last synchronization should be read again.

The memory controller 230 may also control the memory 211 via line 235, by which the memory controller 230 may instruct the memory 211 what memory address is to be read. In this case, the memory controller 230 may keep track of the memory locations read since the last synchronization operation. Then, if synchronization is performed, the memory controller 230 may then request or instruct that those memory locations should be read again.

In another embodiment, the memory controller 230 may synchronize the write pointers whenever there is no data from the memory 211 in the buffer circuits 10A–10H, such as when all of the requested data has been read from the buffer circuits 10A–10H and there are no pending memory read operations.

The embodiments described above therefore allow the write pointers of buffer circuits 10A–10H to be synchronized, which may help to prevent the loss or corruption of data. Further, although the memory controller 230 has been described as reading the states of the various write pointers and then comparing them, part or all of this process may be performed by another circuit. Although the memory cells 11A–11N may provide the data and data strobe asynchronously, they may also provide the data and/or data strobe in accordance with some clock (not shown). Further, although the terms "line" may have been used herein, it is not necessarily intended to refer to just a single conductor or signal path, but may also include multiple conductors or signal paths, such as a bus. In addition, although the environment described above has several memory modules 211A–211L, such as may be present in a computing environment, other embodiments and environments are contemplated, such as in a situation where a buffer is used but where a single device does not control both the read and write pointers, or as in a situation where the state of a write pointer is not written directly into the write pointer, but the write pointer is merely incremented (or decremented). Further, although the read pointer and the write pointer have each been described as having 3 bits, or specifying eight locations, they may have any desired number of bits and may specify any desired number of locations. For example, the write pointer could have 4 bits, for sixteen locations in a correspondingly-sized register 14, and the read pointer could have 5 bits, which would accommodate the sixteen locations in register 14 and the four bits of the write pointer. Extra addresses may be unused or may be used for other purposes.

While an embodiment and its environment have been described above and shown in the accompanying figures, the present invention is not so limited as various modifications may occur to those of ordinary skill in the art upon reading this disclosure. The scope of embodiments of the invention should, therefore, be determined with reference to the appended claims, along with the full scope of equivalents to which such claims are entitled. Further, it is emphasized that the Abstract is provided to comply with 37 C.F.R. § 1.72(b) requiring an Abstract that will enable the United States Patent and Trademark Office and the public generally to determine quickly from a cursory inspection the nature and gist of the technical disclosure. It is submitted with the understanding that, in accordance with 37 C.F.R. §1.72(b), the Abstract will not be used to interpret or limit the scope or meaning of the claims.

We claim:

1. An apparatus, comprising:
   a register having a plurality of bit locations to store data;
   a demultiplexer circuit coupled to the register to direct a bit of incoming data to a selected bit location in the register;
   a write pointer circuit coupled to the demultiplexer circuit to provide a write pointer address for the selected bit location to the demultiplexer circuit, being responsive to a strobe signal to adjust the value of the write pointer address; and being responsive to an input signal to set the write pointer address to a predetermined value; and
   a multiplexer circuit coupled to the register and to the write pointer circuit to provide a data output, the data output being at least one of a selected bit location in the register or a selected bit of the write pointer address.

2. The apparatus of claim 1 wherein the write pointer circuit is response to the input signal to reset the write pointer address.

3. The apparatus of claim 1 wherein the register is responsive to the strobe signal to store the data in the bit location specified by the write pointer address.

4. An apparatus, comprising:
   a register having a plurality of bit locations to store data;
   a demultiplexer circuit coupled to the register to direct a bit of incoming data to a selected bit location in the register;
   a write pointer circuit coupled to the demultiplexer circuit to provide a write pointer address for the selected bit location to the demultiplexer circuit, being responsive to a strobe signal to adjust the value of the write pointer address; and being responsive to an input signal to set the write pointer address to a predetermined value; and
   a multiplexer circuit coupled to the register and to the write pointer circuit to provide a data output, the data output being at least one of a selected bit location in the register or a selected bit of the write pointer address;
   a memory controller coupled to the multiplexer and to the write pointer circuit to cause the multiplexer circuit to select at least one bit of the write pointer address, to determine the write pointer address, and to provide the input signal to set the write pointer address to a predetermined value.

5. The apparatus of claim 4 wherein the write pointer circuit is response to the input signal to reset the write pointer address.

6. The apparatus of claim 4 wherein the register is responsive to the strobe signal to store the data in the bit location specified by the write pointer address.

* * * * *